United States Patent

Livengood

[19]

[11] Patent Number: 6,020,746
[45] Date of Patent: Feb. 1, 2000

[54] METHOD AND APPARATUS FOR PROBING AN INTEGRATED CIRCUIT THROUGH THE BACK SIDE OF AN INTEGRATED CIRCUIT DIE

[75] Inventor: Richard H. Livengood, Los Gatos, Calif.

[73] Assignee: Intel Corporation, Santa Clara, Calif.

[21] Appl. No.: 08/941,888

[22] Filed: Sep. 30, 1997

Related U.S. Application Data

[63] Continuation of application No. 08/771,712, Dec. 20, 1996, Pat. No. 5,948,217, which is a continuation of application No. 08/344,149, Nov. 23, 1994, abandoned.

[51] Int. Cl.⁷ .................................................. H01L 21/66
[52] U.S. Cl. ............................................. 324/754; 438/14
[58] Field of Search ...................................... 324/754, 755, 324/756, 758, 765; 438/4, 14, 694; 174/261, 255; 156/626, 630, 631, 662, 668

[56] References Cited

U.S. PATENT DOCUMENTS

| | | |
|---|---|---|
| 4,632,724 | 12/1986 | Chesebro et al. . |
| 4,650,744 | 3/1987 | Amano . |
| 4,732,646 | 3/1988 | Elsner et al. . |
| 5,064,498 | 11/1991 | Miller . |
| 5,268,065 | 12/1993 | Grupen-Shemansky . |
| 5,438,166 | 8/1995 | Carey et al. .............................. 174/261 |
| 5,838,625 | 11/1998 | Cutter et al. .......................... 365/225.7 |
| 5,840,627 | 11/1998 | Huggins .................................. 438/669 |
| 5,843,844 | 12/1998 | Miyanaga ................................ 438/694 |
| 5,844,295 | 12/1998 | Tsukude et al. ......................... 257/529 |

FOREIGN PATENT DOCUMENTS

| | | |
|---|---|---|
| 0 295 065 | 12/1988 | European Pat. Off. . |
| 56-46534 | 4/1981 | Japan . |
| 59-44827 | 3/1984 | Japan . |
| 1-119037 | 5/1989 | Japan . |

OTHER PUBLICATIONS

Paul Winer,"IC Failure Analysis, E–Beam Tutorial," International Reliability and Physics Symposium, (No Month) 1996.

Scott Silverman, "Laser Microchemical Technology Enables Real–Time Editing of First–Run Silicon," Solid State Technology, Sep. 1996.

Ann N. Campbell, Fault Localization with the Focused Ion Beam (FIB) System, in Microelectronic Failure Analysis, ASM International, Nov. 1996.

*Primary Examiner*—Josie Ballato
*Assistant Examiner*—T. R. Sundaram
*Attorney, Agent, or Firm*—Blakely, Sokoloff, Taylor & Zafman LLP

[57] ABSTRACT

A method and an apparatus for probing signals from an integrated circuit through the back side of an integrated circuit die. In one embodiment, a passive diffusion is disposed in a semiconductor substrate of a flip-chip mounted integrated circuit die. The passive diffusion is coupled to a signal line through a contact. The signal line carries the integrated circuit signal of interest. In one embodiment, the disclosed passive diffusion is oversized to reduce attenuation of a signal acquired from the passive diffusion. In addition, the disclosed passive diffusion is laterally spaced from nearby diffusions in the semiconductor substrate of the integrated circuit to enable exposure of the passive diffusion with a reduced risk of damaging nearby structures in the integrated circuit die, such as for example other diffusions, during the exposing process. Moreover, the disclosed passive diffusion is laterally spaced from nearby diffusions to reduce crosstalk interference from the nearby diffusions.

27 Claims, 9 Drawing Sheets

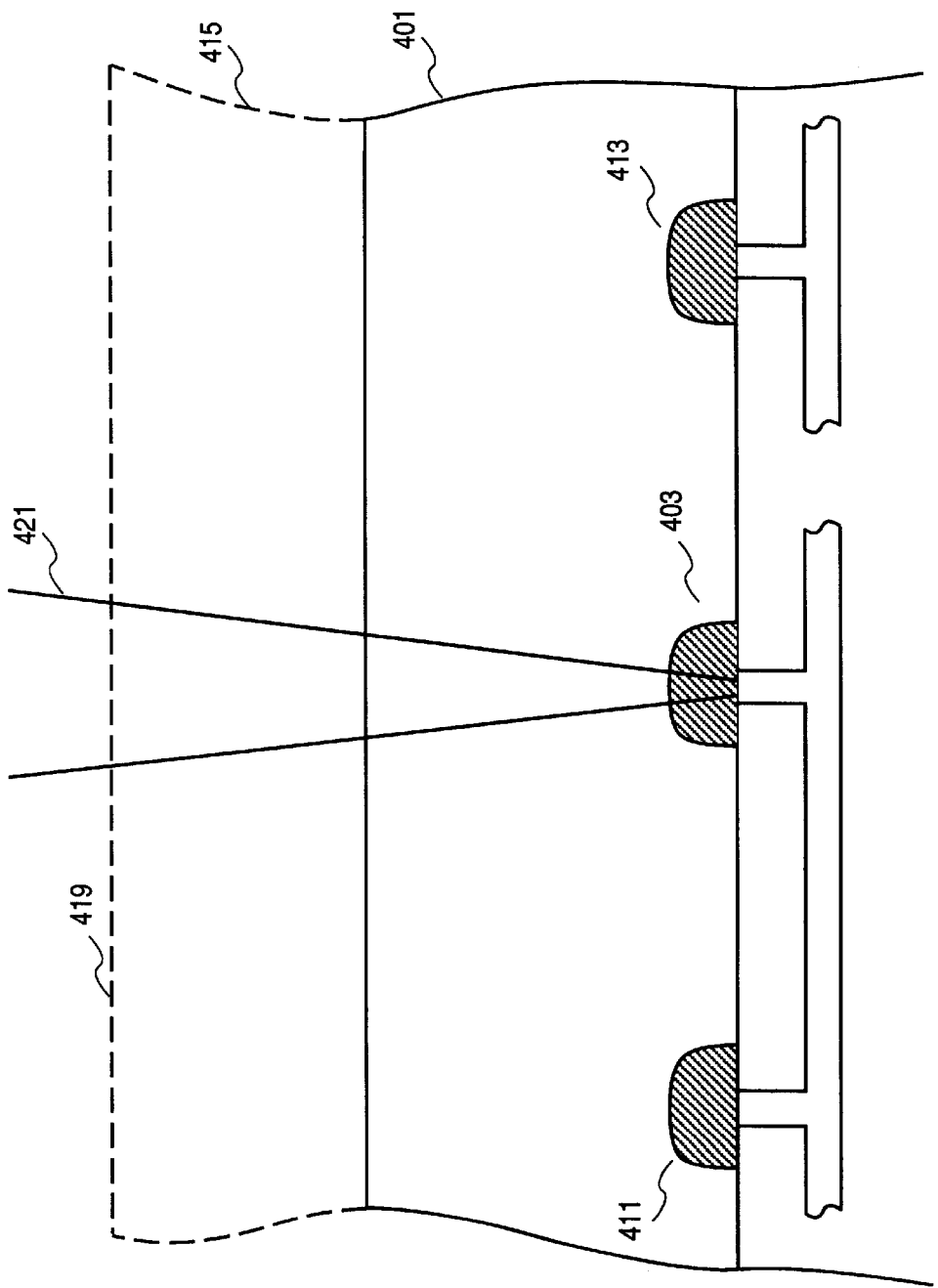

METHOD AND APPARATUS FOR PROBING AN INTEGRATED CIRCUIT THROUGH THE BACK SIDE OF AN INTEGRATED CIRCUIT DIE

RELATED APPLICATIONS

This application is a continuation of application Ser. No. 08/771,712 filed Dec. 20, 1996, now U.S. Pat. No. 5,948,217, which itself is a continuation of application Ser. No. 08/344,149 filed Nov. 23, 1994, now abandoned.

This application is related to application Ser. No. 08/724,223, filed Oct. 2, 1996, entitled "A Method of Accessing the Circuitry on a Semiconductor Substrate from the Bottom of the Semiconductor Substrate," and assigned to the Assignee of the present application, which is a continuation of application Ser. No. 08/344,149, filed Nov. 23, 1994, now abandoned.

This application is also related to U.S. Pat. No. 5,872,360, issued Feb. 16, 1999 entitled "Method and Apparatus Using an Infrared Laser Based Optical Probe for Measuring Electric Fields Directly From Active Regions in an Integrated Circuit," and assigned to the Assignee of the present application now U.S. Pat. No. 5,948,217.

This application is also related to co-pending application Ser. No. 08/940,830, filed Sep. 30, 1997, entitled "Method and Apparatus Providing a Circuit Edit Structure Through the Back Side of an Integrated Circuit Die," and assigned to the Assignee of the present application.

This application is also related to U.S. Pat. No. 5,904,486, issued May 18, 1999, entitled "Method and Apparatus For Performing a Circuit Edit Through the Back Side of an Integrated Circuit Die," and assigned to the Assignee of the present application.

This application is also related to co-pending application Ser. No. 08/941,887, filed Sep. 30, 1997, entitled "Method and Apparatus Providing a Mechanical Probe Structure in an Integrated Circuit Die," and assigned to the Assignee of the present application.

FIELD OF THE INVENTION

The present invention relates generally to the field of integrated circuit testing and, more particularly, to a method and an apparatus for probing an integrated circuit.

BACKGROUND INFORMATION

Once a newly designed integrated circuit has been formed on a semiconductor substrate, the integrated circuit must be thoroughly tested to ensure that the circuit performs as designed. Portions of the integrated circuit that do not function properly are identified so that they can be corrected by modifying the design of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use.

During the debugging process, it is sometimes necessary to probe certain internal electrical nodes in the integrated circuit in order to obtain important electrical data from the integrated circuit, such as for example voltage levels, timing information, current levels, thermal information or the like. The typical integrated circuit device contains multiple layers of metal interconnects. The metal interconnects in the first layer of an integrated circuit device generally carry the most valuable electrical data for debugging purposes. Metal interconnect lines in the first metal layer reside closest to the semiconductor substrate and are usually directly coupled to important components of the integrated circuit device such as for example transistors, resistors and capacitors. It is the electrical data received, manipulated and transmitted by these components that a designer is most interested in analyzing during the debugging process.

FIG. 1A is an illustration of an integrated circuit package 101 that includes wire bonds 103 disposed along the periphery of integrated circuit die 105 to electrically connect integrated circuit connections through metal interconnects 113 to pins 107 of package substrate 111. As shown in FIG. 1A, metal interconnects 113 are coupled to diffusion regions 117 through metal contacts 109. In some instances, diffusion regions 117 may be used in integrated circuit devices such as transistors, resistors, capacitors or the like. As shown in FIG. 1A, a probe tool 115 may be used to probe metal interconnect 113 through the top side 119 of integrated circuit die 105 to obtain the electrical data from integrated circuit die 105.

There are several disadvantages with the wire bond design of integrated circuit package 101 of FIG. 1A. One problem stems from the fact that as the density and complexity of integrated circuit die 105 increases, so must the number of wire bonds 103 required to control the functions integrated circuit die 105. However, there are only a finite number of wire bonds 103 that can fit along the periphery of integrated circuit die 105. One way to fit more wire bonds 103 along the periphery of integrated circuit die 105 is to increase the overall size of integrated circuit die 105, thereby increasing its peripheral area. Unfortunately, an increase in the overall size of integrated circuit die 105 also significantly increases the integrated circuit manufacturing costs.

Another disadvantage with integrated circuit package 101 of FIG. 1A is that the active circuitry within integrated circuit die 105 must be routed through electrical interconnects 113 to the peripheral region of integrated circuit die 105 in order to electrically couple the active circuitry to wire bonds 103. By routing these metal interconnect lines 113 over a relatively long distance across the integrated circuit die 105, the increased resistive, capacitive and inductive effects of these lengthy interconnects 113 result in an overall speed reduction of the integrated circuit. In addition, the inductance of wire bonds 103 may also severely limit high frequency operation of integrated circuit devices in integrated circuit package 101.

With continuing efforts in the integrated circuit industry to increase integrated circuit speeds as well device densities, there is a trend towards using flip-chip technology when packaging complex high speed integrated circuits. Flip-chip technology is also known as control collapse chip connection (C4) packaging. In flip-chip packaging technology, the integrated circuit die is flipped upside-down. This is opposite to how integrated circuits are packaged today using wire bond technology, as illustrated in FIG. 1A. By flipping the integrated circuit die upside-down, ball bonds may be used to provide direct electrical connections from the bond pads directly to the pins of a flip-chip package.

To illustrate, FIG. 1B shows a flip-chip package 151 with an integrated circuit die 155 flipped upside-down relative to the wire bonded integrated circuit die 105 of FIG. 1A. In comparison with wire bonds 103 of FIG. 1A, ball bonds 153 of flip-chip package 151 provide more direct connections between the circuitry integrated circuit die 155 and the pins 157 of package substrate 161 through metal interconnects 159. As a result, the inductance problems that plague typical wire bond integrated circuit packaging technologies are reduced. Unlike wire bond technology, which only allows bonding along the periphery of the integrated circuit die 155, flip-chip technology allows connections to be placed anywhere on the integrated circuit die surface. This results in reduced inductance power distribution to the integrated circuit, which is another major advantage of flip-chip technology.

One consequence of integrated circuit die 155 being flipped upside-down in flip-chip package 151 is that access to the internal nodes of integrated circuit die 155 for debugging purposes has become a considerable challenge. As discussed above, the present day debug process for wire bond technology is based in part on directly probing the metal interconnects through the front side of the integrated circuit die. However, with flip-chip packaging technology, this front side methodology is not feasible since the integrated circuit die is flipped upside-down. For example, as illustrated in FIG. 1B, access to the metal interconnects 159 for the purpose of conventional probing is obstructed by the package substrate 161. Instead, the P-N junctions forming diffusion regions 163 of the integrated circuit are accessible through the back side 165 of the semiconductor substrate of integrated circuit die 155.

FIG. 2 is an example schematic of an integrated circuit 201 that includes a circuit 203 having inputs 205 and 207, and an output 209. As shown in FIG. 2, input 205 is generated by circuit 211 and input 207 is generated by circuit 213. It is appreciated that the example schematic illustrated in FIG. 2 is only one of a countless number of different integrated circuit combinations which may be included in an integrated circuit die.

Assuming a circuit designer wishes to debug integrated circuit 201, it may be desirable to probe signals from inputs 205 and 207, and from output 209. Assume further that the metal interconnects associated with input 205, input 207 and output 209 of FIG. 2 correspond to metal interconnects 159 of FIG. 1B. In this illustration, access to metal interconnects 159 is limited because metal interconnects 159 are obstructed by diffusion regions 163. As a result, the circuit designer would be unable to probe metal interconnects using prior art techniques.

In some instances, it is also not possible to probe input 205, input 207 and output 209 of FIG. 2 through diffusion regions 163 of FIG. 1B. In particular, if diffusion regions 163 are active forward biased transistor diffusions, milling through the semiconductor substrate of integrated circuit die 155 through the back side 165 to expose one of the diffusion regions 163 for probing purposes would damage the forward biased P-N junction. In addition, the lateral spacing between diffusion regions 163 is often insufficient to make feasible the milling away of semiconductor substrate of integrated circuit die 155 from the back side 165 for probing purposes. For instance, diffusion regions 163 are often so closely spaced such that the exposure of a particular diffusion region 163 by milling would often result in the unwanted destruction of nearby structures and/or diffusion regions.

Referring back to FIG. 2, it is also noted that an electrostatic discharge (ESD) protection diode 217 is coupled between input 207 and ground. As is well known in the art, ESD protection diodes such as diode 217 are sometimes coupled to the input gates of transistors in situations where there is not a nearby diffusion region to provide a short ESD path to ground from a transistor gate. To illustrate, the diffusion regions (not shown) of the transistors of circuit 211 provide a nearby ESD path to ground from the gate of the transistor at input 205. Thus, an ESD protection diode is not placed at input 205. In contrast, the diffusion regions (not shown) of circuit 213 are relatively far from the input gates coupled to input 207, thereby resulting in a high metal-to-diffusion ratio associated with input 207. As such, ESD protection diode 217 is placed between input 207 and ground to help protect the gates coupled to input 207 from an ESD event. Note that there is no ESD protection diode coupled to output 209 since there is no input gate at output 209 that needs to be protected from an ESD event.

In sum, ESD protection diodes such as diode 217 are in general only placed on integrated circuit inputs that have a relatively high metal-to-diffusion ratio. ESD protection diodes are generally not placed on integrated circuit outputs nor on integrated circuit inputs with relatively low metal-to-diffusion ratios in the prior art.

In view of the foregoing, what is desired is an improved method and apparatus for probing integrated circuits. Such a method and apparatus should enable the probing of signals through the back side of modern day flip-chip packaged integrated circuits. In addition, such a method and apparatus should allow the probing of both input and output signals of integrated circuits.

SUMMARY OF THE INVENTION

A method and an apparatus for probing an integrated circuit is disclosed. In one embodiment, a probe structure is described, which includes a signal line disposed in a dielectric isolation layer of an integrated circuit die and a passive diffusion coupled to the signal line. The passive diffusion is disposed in a semiconductor substrate of the integrated circuit die and is laterally spaced in the semiconductor substrate at least approximately 1.0 microns from a nearest active diffusion disposed in the semiconductor substrate of the integrated circuit die. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 4B is an illustration of a cross-section of an integrated circuit die that is globally thinned and/or locally trenched from the back side of the integrated circuit die having a probe structure in accordance with the teachings of the present invention.

DETAILED DESCRIPTION

A method and an apparatus for probing an integrated circuit is disclosed. In the following description, numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention. While the diagrams representing embodiments of the present inventions are illustrated in FIGS. 3–6, these illustrations are not intended to limit the invention. The specific steps described herein are only meant to help clarify an understanding of the present invention and to illustrate various embodiments of how the present invention may be implemented in order to achieve a desired result. For the purposes of this discussion, a semiconductor substrate may be a substrate including any material or materials used in the manufacture of a semiconductor device.

Figure 1A:
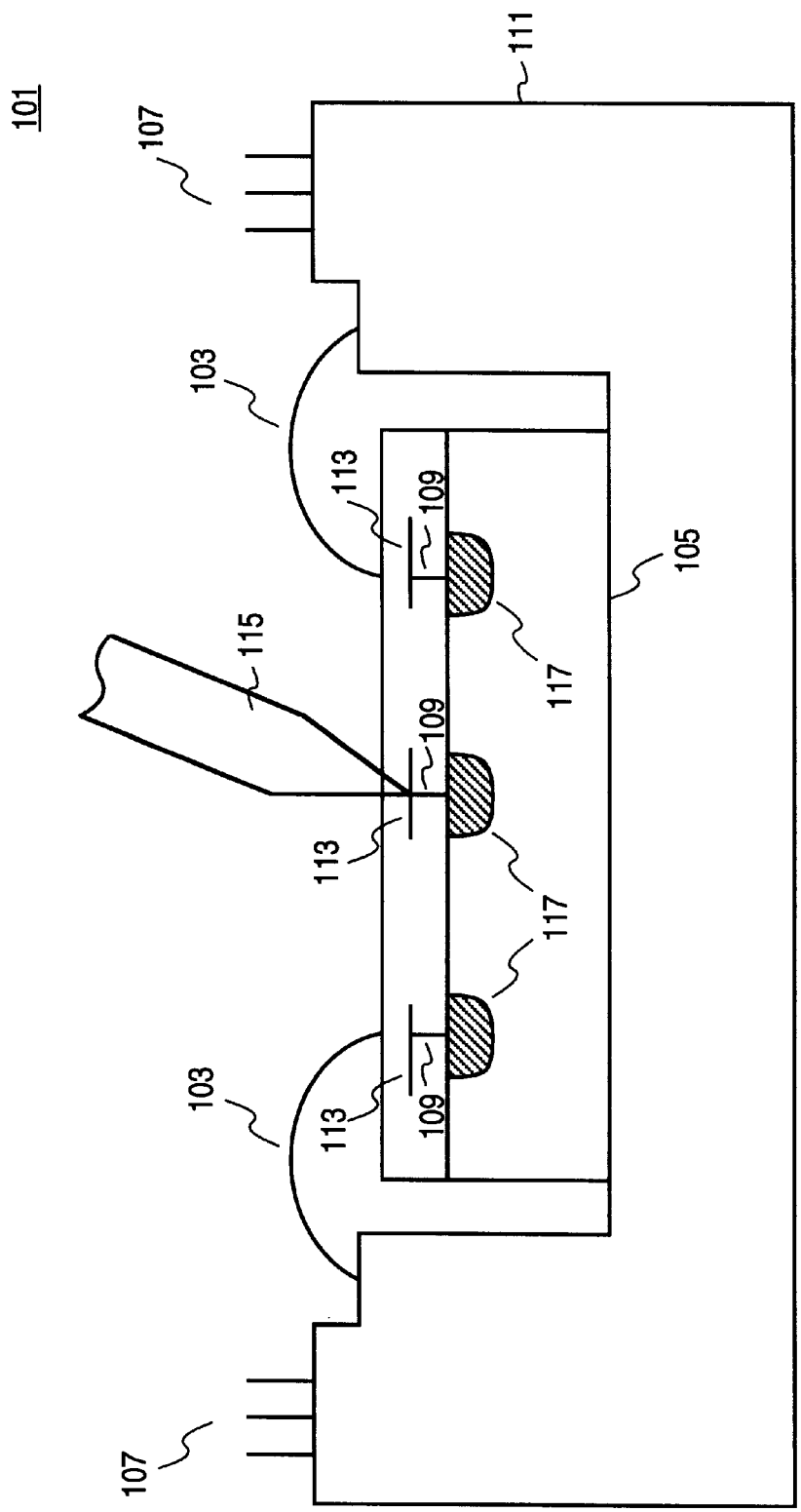
FIG. 1A is an illustration showing prior art wire bond technology.
Figure 1B:
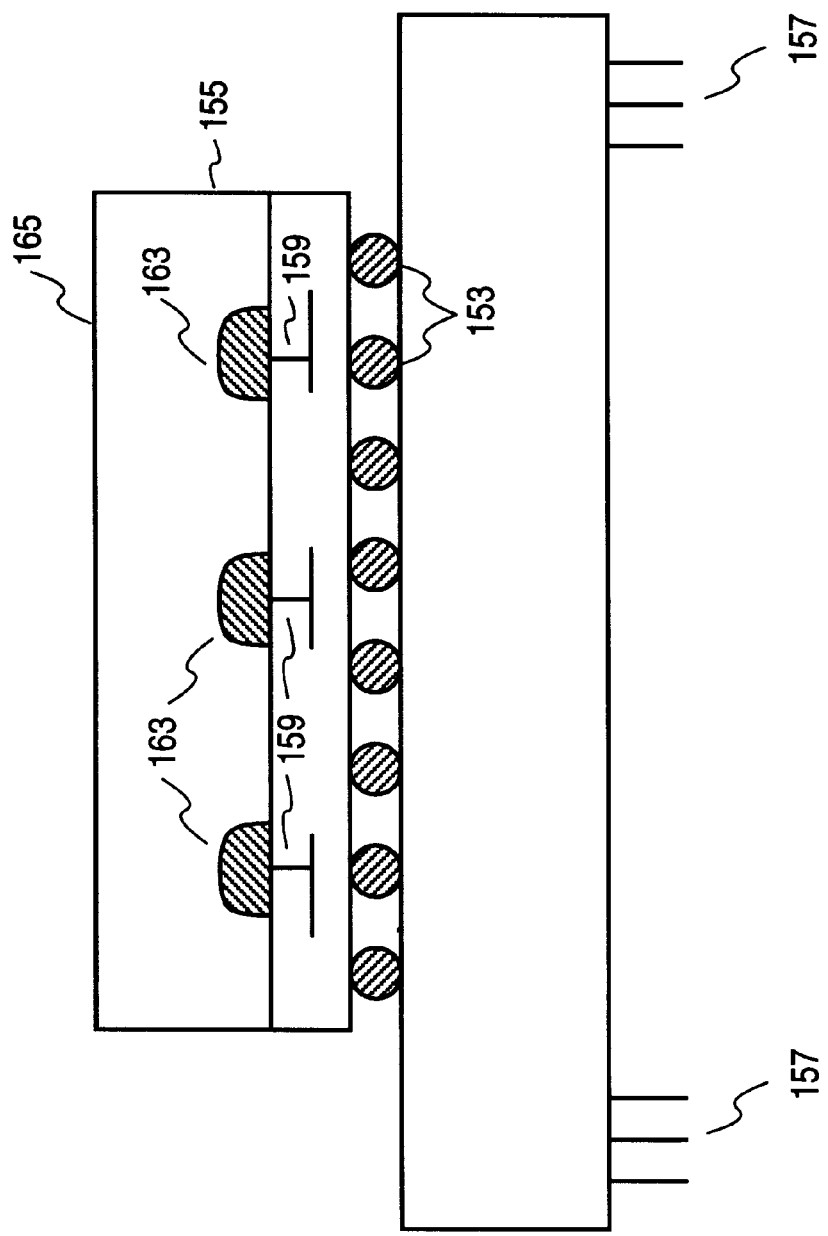
FIG. 1B is an illustration showing prior art flip-chip or C4 packaging technology.

The present invention is directed to a method and an apparatus that provides a novel probe structure that may be used in conjunction with electron beam, ion beam, mechanical, and other well known similar probing techniques. As discussed earlier, the probing of signal lines through the front side of an integrated circuit die is a useful technology for debugging logic, timing, speed path or other problems associated with newly developed microprocessors, micro-controllers, memory chips and the like. With the continuing migration of packaging technology from wire bond technology to flip-chip technology, as shown in FIGS. 1A and 1B respectively, it is desired to develop the capability to probe signals through the back side of the integrated circuit die.

Figure 3:
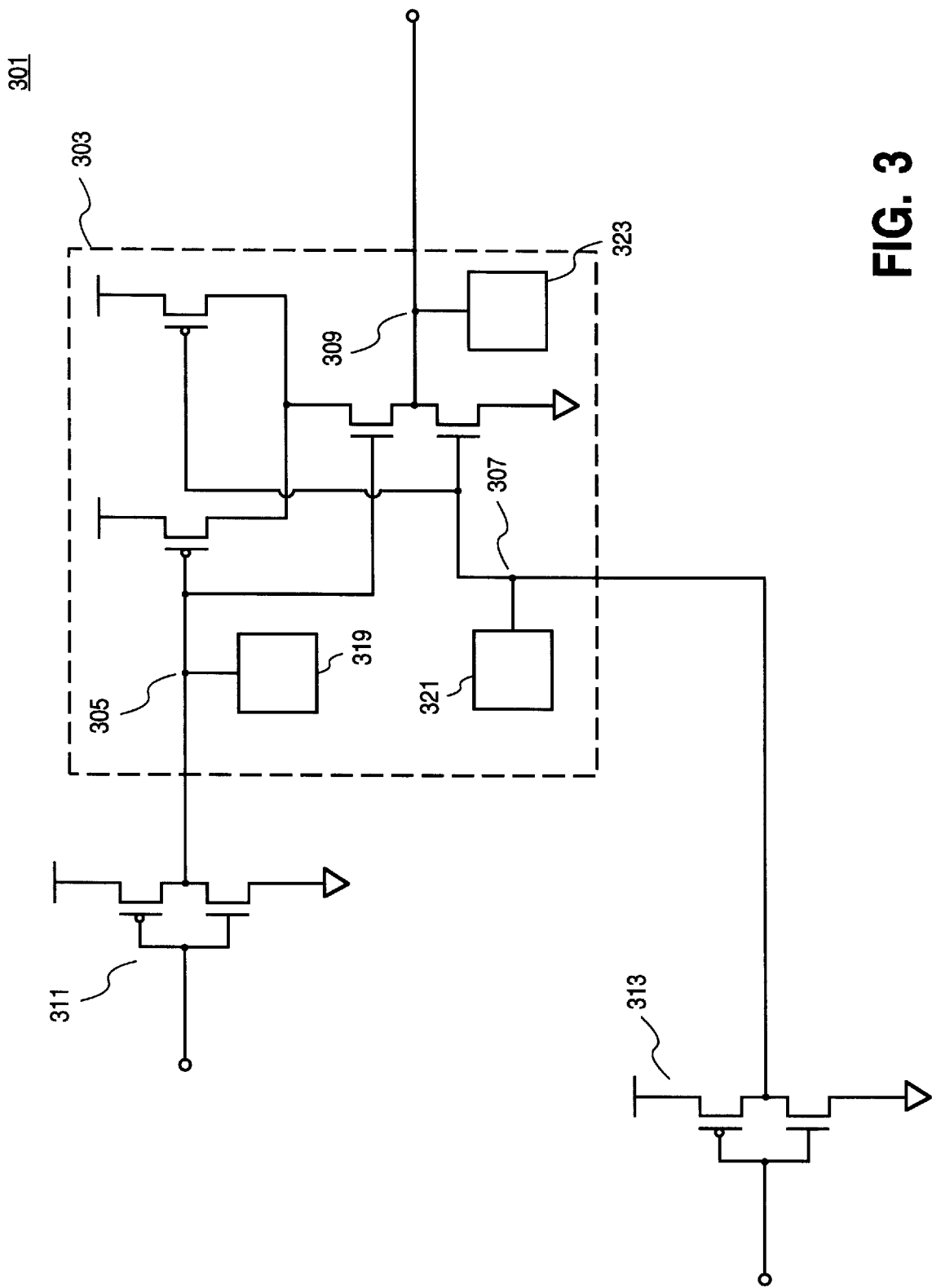
FIG. 3 is a schematic of an integrated circuit having inputs and an output that may be probed in accordance with the teachings of the present invention.

FIG. 3 is a schematic of an integrated circuit 301 including passive probe structures 319, 321 and 323 in accordance with the teachings of the present invention. In the illustrated embodiment, integrated circuit 301 is included in a flip-chip mounted integrated circuit die. Integrated circuit 301 includes a circuit 303 having an input 305, an input 307 and an output 309. Input 305 is coupled to receive an output of circuit 311 and input 307 is coupled to receive an output of circuit 313. Probe structure 319 is coupled to an input gate of a transistor at input 305, probe structure 321 is coupled to an input gate of a transistor at input 307 and probe structure 323 is coupled to an output transistor drain and source at output 309. It is appreciated that the example schematic illustrated in FIG. 3 is also only one of a countless number of different integrated circuit combinations that may be probed in accordance with the teachings of the present invention.

With probe structures 319, 321 and 323, probe access to input 305, input 307 and output 309 is available through the back side of the flip-chip packaged integrated circuit in accordance with the teachings of the present invention. Without probe structures 319, 321 and 323, probe access to input 305, input 307 and output 309 may not be feasible through the back side of the integrated circuit die. As discussed earlier with respect to FIG. 2, access to the signal lines that correspond to input 205, input 207 and output 209 is obstructed by the package substrate from the front side of the integrated circuit die. In addition, access to these signal lines from the back side of the integrated circuit die may be obstructed by various diffusions in the semiconductor substrate.

Figure 2:
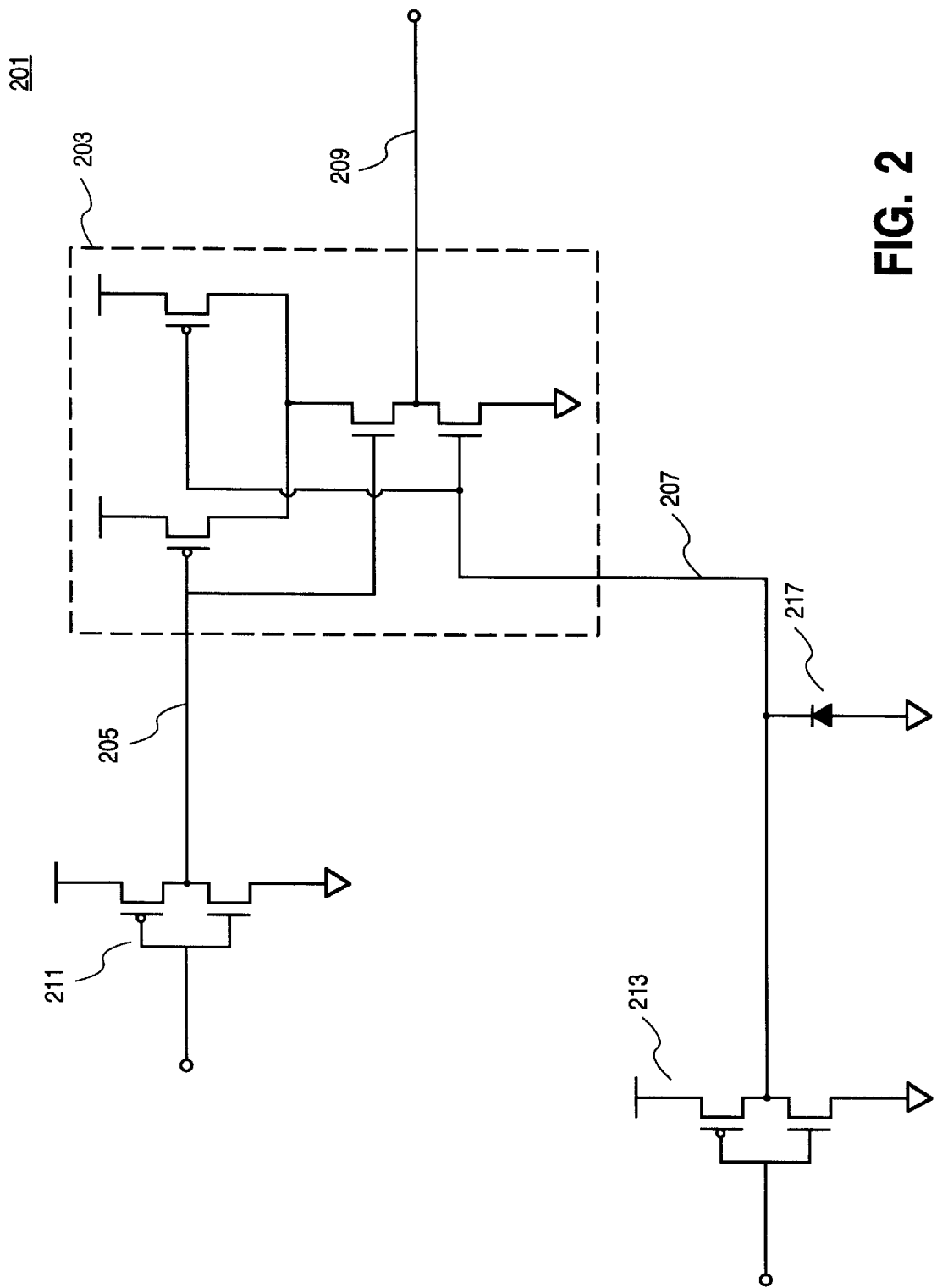
FIG. 2 is a schematic of an integrated circuit having inputs and an output that a circuit designer may desire to probe during debug.

It is noted that in some instances, ESD protection diode 217 of FIG. 2 may provide some limited access to input 207. However, since ESD protection diodes are, in general, limited only to integrated circuit inputs that having a high metal-to-diffusion ratio, there is no similar access to input 205 and output 209. Furthermore, with the continuing trend to increase the device density of integrated circuits, ESD protection diodes are continually decreasing in size and are also closely packed near other diffusions with minimal lateral spacing in the integrated circuit die. Consequently, it is commonly difficult or even impossible to probe signals from ESD protection diodes, such as for example ESD protection diode 217 of FIG. 2.

A difficulty of using ESD protection diodes as probe structures is a consequence of the low signal-to-noise ratio of probed signals caused in part by the attenuation of signals acquired across the relatively small diffusions of ESD protection diodes. Furthermore, since it is common for diffusions to be so densely packed in the semiconductor substrates with minimal lateral spacing, there is increased crosstalk interference in probed signals, further reducing the signal-to-noise ratio. Moreover, it is also difficult to expose the closely packed ESD protection diode diffusions through the back side of an integrated circuit die without damaging nearby diffusions and/or structures.

The diffusions of the presently described passive probe points 319, 321 and 323 are oversized in comparison to other diffusions in the semiconductor substrate to reduce attenuation of probed signals, thereby increasing the signal-to-noise ratio of acquired signals with the present invention. In addition, the diffusion regions of probe structures 319, 321 and 323 also have adequate lateral spacing from other diffusions in the integrated circuit die to enable access from the back side of the integrated circuit die, reduce crosstalk interference from nearby diffusions, as well as reduce leakage currents to the semiconductor substrate when the presently described probe structures are exposed in accordance with the teachings of the present invention.

In one embodiment of the present invention, passive probe structures coupled to the inputs and outputs of integrated circuits are included in a circuit designer's cell library using well known techniques, such as for example circuit 303, for use during integrated circuit design. Accordingly, integrated circuits with the presently described probe structures are preconfigured at circuit design time to include structures that will enable the probing of signals from either inputs or outputs, depending on whether the presently described passive probe structures are coupled to the corresponding inputs or outputs.

In yet another embodiment, the presently described probe structures are included in the cell libraries as independent circuit elements using well known techniques. In this embodiment, circuit designers may include the presently described passive probe structures at individual inputs and outputs of integrated circuits in instances where the circuit designers know at circuit design time that there may be a desire to probe signals from designated integrated circuit inputs or outputs. With the presently described passive probe structure, these probe signals may be obtained through the back side of the flip-chip mounted integrated circuit die.

Figure 4A:
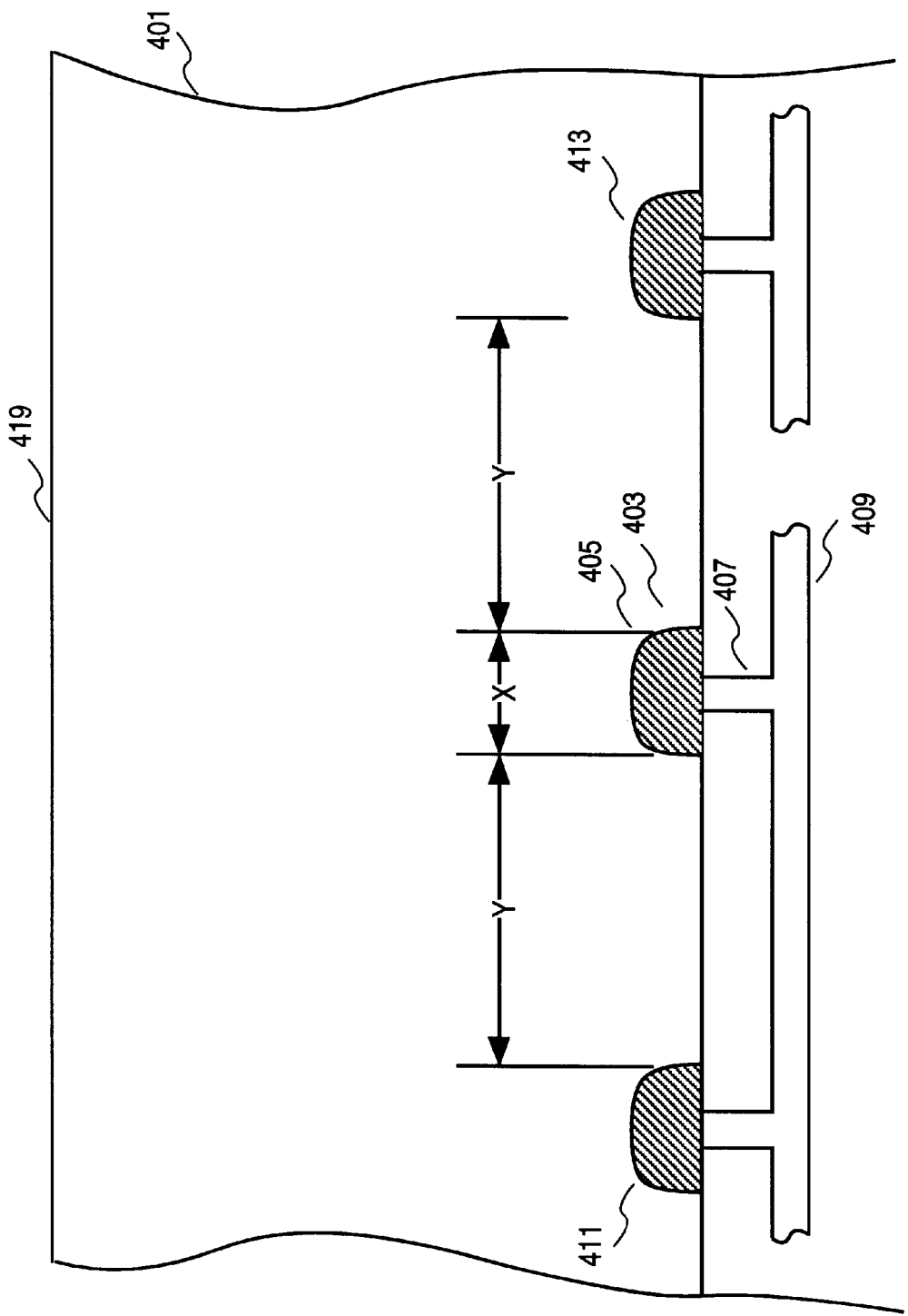
FIG. 4A is an illustration of a cross-section of a probe structure in accordance with the teachings of the present invention in relation to other diffusion regions of an integrated circuit die.

FIG. 4A is an illustration of a cross-section of a flip-chip mounted integrated circuit die 401 having a passive probe structure 403 in accordance with the teachings of the present invention. As shown in the embodiment illustrated in FIG. 4A, probe structure 403 includes passive diffusion 405 disposed in a semiconductor substrate of integrated circuit die 401 coupled to signal line 409 through contact 407. For the purposes of this disclosure, a passive diffusion may simply be interpreted as a diffusion disposed in a semiconductor substrate for providing a signal access location. In one embodiment, signal line 409 is made of a conductive material, such as metal, polysilicon or the like. In one embodiment, the semiconductor substrate of integrated circuit die 401 includes silicon. In another embodiment, signal line 409 is disposed in the dielectric isolation layer of integrated circuit die 401 and is coupled to active diffusion 411. In yet another embodiment, active diffusion 411 may be part of a transistor, capacitor or any other integrated circuit element from which an integrated circuit debugger wishes to obtain a signal. It is noted that signal line 409 may be coupled to any integrated circuit element from which a circuit designer desires to obtain a probe signal. For purposes of this disclosure, an active diffusion may be interpreted as any diffusion disposed n the semiconductor substrate that is functionally active during normal operation of the integrated circuit.

In one embodiment, passive diffusion 405 is oversized relative to other active transistor diffusions in the semiconductor substrate. In one embodiment, passive diffusion 405 has a cross-sectional area of at least $X^2$ square microns and a minimum width of at least X microns. In one embodiment, X is at least one micron. By ensuring that passive diffusion has an adequate cross-sectional area, attenuation of probe signals across passive diffusion 405 during probing is reduced, thereby increasing the signal-to-noise ratio of a probed signal.

In another embodiment, passive diffusion 405 is laterally spaced at least Y microns from a closest nearby diffusion, such as for example active diffusions 411 and 413. In one embodiment, Y is at least 1.0 microns. With the presently described lateral spacing of passive diffusion 405, crosstalk interference from neighboring diffusions, such as active diffusions 411 and 413, is reduced and probe access to passive diffusion 405 is provided through the back side of integrated circuit die 401 with a reduced risk of damaging nearby diffusions, such as active diffusions 411 and 413, when probe structure 403 is accessed for probing purposes.

In one embodiment, probe structure 403 is probed through the back side of a silicon semiconductor substrate using an infrared photon beam probe tool. FIG. 4B illustrates an embodiment with probe structure 403 being probed with an infrared laser beam 421. Infrared photon beam probe techniques through the back side of a silicon semiconductor substrate are described in co-pending application Ser. No. 08/766,149, filed Dec. 12, 1996 entitled "Method and Apparatus Using an Infrared Laser Based Optical Probe for Measuring Electric Fields Directly From Active Regions in an Integrated Circuit," and assigned to the Assignee of the present application.

In another embodiment of the present invention, probe structure 403 is exposed to provide access for probing. In one embodiment, probe structure 403 may be probed using a particle beam probe tool, such as for example an electron beam probe tool, an ion beam probe tool, or a photon beam probe tool. In another embodiment, a mechanical probe tool may be used to access probe structure 403. It is noted that helpful techniques for mechanically probing a flip-chip packaged integrated circuit die are described in co-pending application Ser. No. 08/941,887, filed Sep. 30, 1997, entitled "Method and Apparatus Providing a Mechanical Probe Structure in an Integrated Circuit Die," and assigned to the Assignee of the present application.

In one embodiment, when probe structure 403 is exposed for probe purposes, flip-chip mounted integrated circuit die 401 is first thinned in the region above probe structure 403. This aspect of the present invention is illustrated in FIG. 4B with back side portion 415 of integrated circuit die 401 being removed above probe structure 403 from back side 419. In one embodiment, integrated circuit die 401 is globally thinned to a thickness of approximately 200 microns using well known polishing techniques. In another embodiment, integrated circuit die 401 may be locally trenched in the region above probe structure 403 using well known techniques. It is noted that helpful techniques for thinning a flip-chip packaged integrated circuit die and accessing circuitry from the back side of a flip-chip packaged integrated circuit die are described in co-pending application Ser. No. 08/724,223, filed Oct. 2, 1996, entitled "A Method of Accessing the Circuitry on a Semiconductor Substrate from the Bottom of the Semiconductor Substrate," and assigned to the Assignee of the present application, which is a continuation of application Ser. No. 08/344,149, filed Nov. 23, 1994, now abandoned.

Figure 4C:
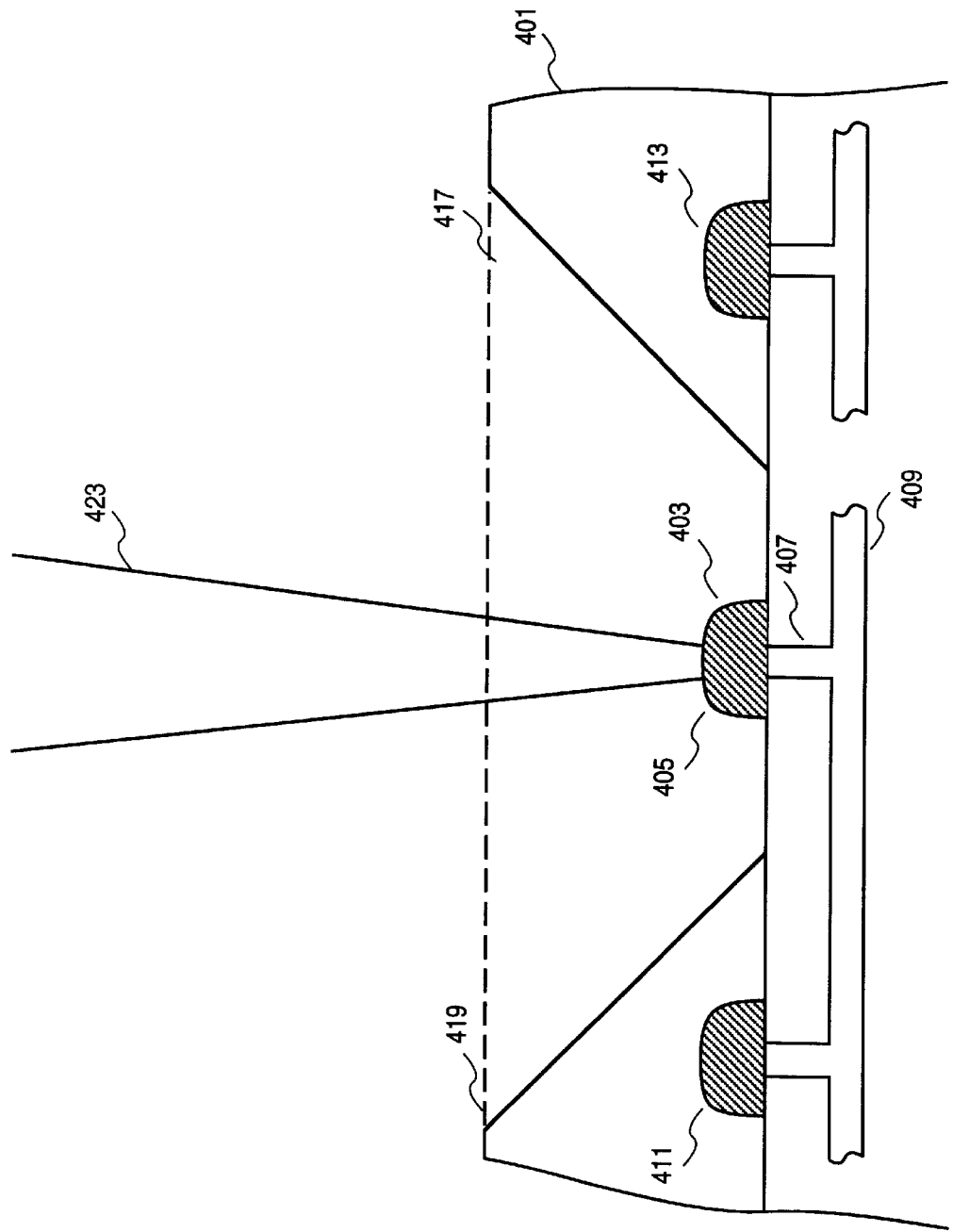
FIG. 4C is an illustration of a cross-section of an integrated circuit die having a probe structure that is exposed in accordance with the teachings of the present invention.

After the thinning step shown in FIG. 4B, probe structure 403 is exposed by milling away a portion 417 of the semiconductor substrate above probe structure 403 to expose passive diffusion 405 and/or contact 407 from back side 419. This aspect of the present invention is illustrated in FIG. 4C. As shown in FIG. 4C, probe structure 403 may be probed using well known techniques with a particle beam 423. Particle beam may be a photon beam, an ion beam, an electron beam or the like.

In one embodiment, probe structure 403 is exposed by using well known milling techniques, such as for example a focused ion beam milling tool. In one embodiment, gallium ions are used in the focused ion beam milling tool. It is noted that useful techniques for endpointing while milling an integrated circuit are described in co-pending application Ser. No. 08/771,712, filed Dec. 20, 1996, entitled "Method and Apparatus for Endpointing While Milling an Integrated Circuit," and assigned to the Assignee of the present application.

As discussed with respect to FIG. 4A, with the increased lateral spacing of passive diffusion 405 from neighboring diffusions, such as active diffusions 411 and 413, unobstructed access to probe structure 403 from back side 419 is provided to enable portion 417 to be removed from the back side of integrated circuit die 401 with a reduced risk of damaging nearby diffusions, such as active diffusions 411 and 413, during the milling process. Moreover, with the increased lateral spacing, the risk of a short to ground from passive diffusion 405 to the nearby semiconductor substrate of integrated circuit die 401 is reduced. In particular, a focused ion beam milling tool using gallium ions is used to expose passive diffusion 405 in one embodiment of the present invention. The focused ion beam mill tool therefore implants gallium in the neighboring dielectric isolation layer during the milling process of passive diffusion 405. By ensuring that passive diffusion 405 is adequately spaced apart from nearby diffusions, such as active diffusions 411 and 413, the lateral size of the opening above passive diffusion 405 may be adequately large to reduce any leakage current from passive diffusion 405 to the remaining portion of the semiconductor substrate of integrated circuit die 401 through the gallium implanted by the focused ion beam tool while passive diffusion 405 was exposed.

Figure 5:
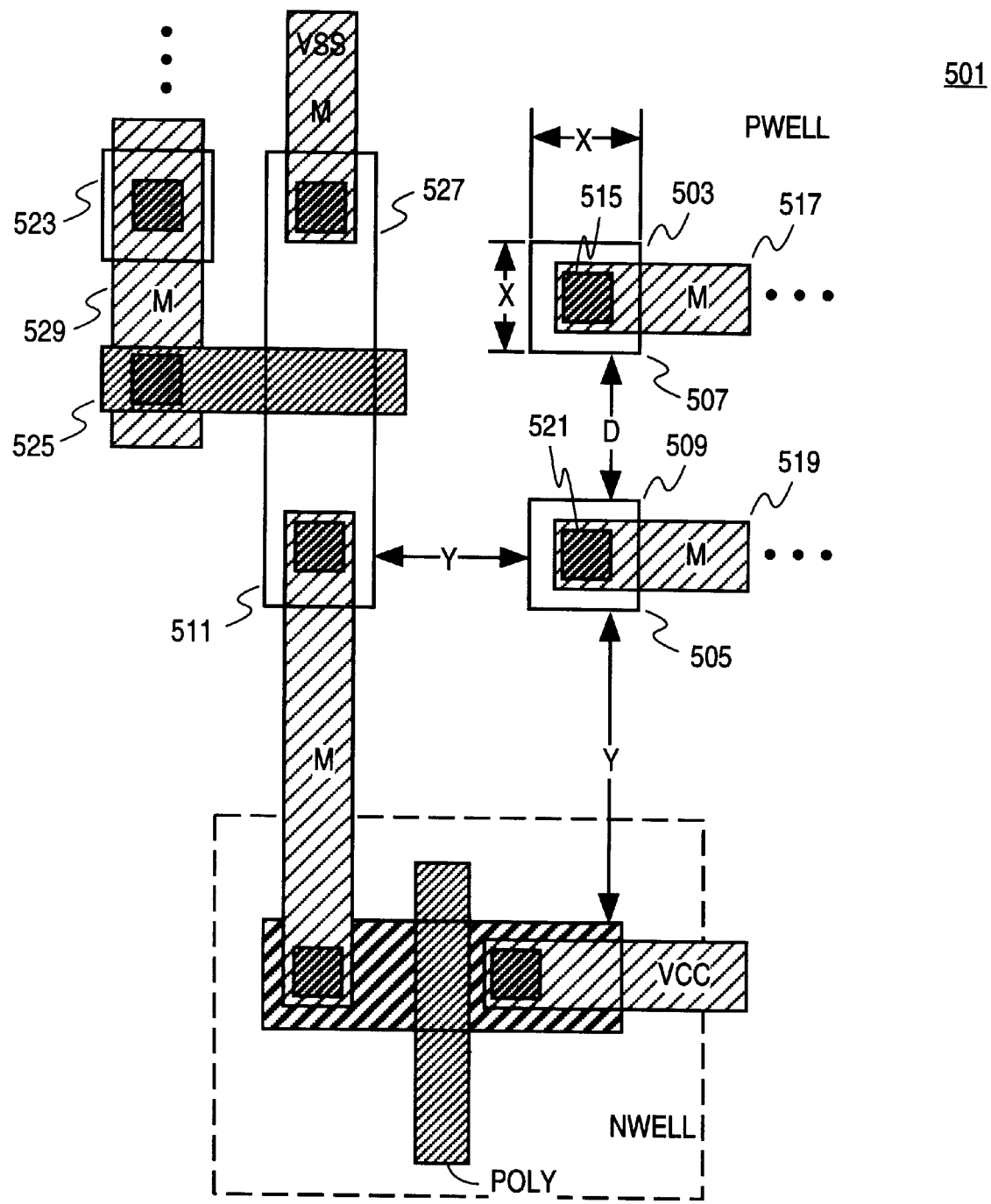
FIG. 5 is a top view diagram of an integrated circuit die having probe structures in accordance with the teachings of the present invention in relation to other integrated circuit devices in the integrated circuit die.

FIG. 5 is a top view diagram of flip-chip packaged integrated circuit die 501 showing passive probe structures 503 and 505 in accordance with the teachings of the present invention. In the embodiment shown in FIG. 5, passive probe structures 503 and 505 include passive diffusions 507 and 509 disposed in the semiconductor substrate of integrated circuit die 501. In one embodiment, passive diffusions 507 and 509 are N+ diffusions in a P well. In another embodiment, passive diffusions 507 and 509 may be P+ diffusions in an N well. As shown in FIG. 5, passive diffusion 507 has the width of at least X microns to help ensure a minimum cross-sectional area to help reduce attenuation of a signal acquired from the presently described probe structure. In addition, as shown in FIG. 5, the passive diffusions 507 and 509 of passive probe structures 503 and 505 have a lateral spacing of at least D microns from one another to reduce the risks of crosstalk interference and leakage current discussed earlier. In one embodiment, D is at least 1.0 microns. As illustrated in FIG. 5, passive diffusions 507 and 509 of passive probe structures 503 and 505 have the lateral spacing of at least Y microns from the nearest active diffusions 511 and 513.

The passive diffusion 507 of the embodiment shown in FIG. 5 is coupled through contact 515 to signal line 517 to enable the probing of a signal carried on signal line 517. Passive diffusion 509 is coupled to signal line 519 through contact 521 to enable the probing of the signal carried on signal line 519. It is appreciated that signal lines 517 and 519 may be coupled to either inputs or outputs of an integrated circuit, or any other integrated circuit node of interest. Thus, signal lines 517 and 519 may be directly coupled to an input gate of another transistor (not shown) or to the output drain or source of another transistor (not shown).

FIG. 5 also shows an ESD protection diode 523 coupled to the input gate 525 of a transistor 527 through signal line 529. As shown in FIG. 5, the lateral spacing of the diffusion of ESD protection diode 523 from nearby diffusions is insufficient to reduce the risks of crosstalk interference. Moreover, the relatively small cross-sectional area of the diffusion of ESD protection diode 523 results in excessive attenuation of signals that are acquired through ESD protection diode 523. In addition, since the lateral spacing between the diffusion of ESD protection diode 523 and nearby diffusions is relatively small, it may be very difficult or even impossible to expose the diffusion of ESD protection diode 523 for probe purposes without damaging the diffusion of nearby transistor 527. Furthermore, even if the diffusion of ESD protection diode 523 is successfully exposed with a focused ion beam milling tool without damage to nearby diffusions, there may be an unacceptably high leakage current to the semiconductor substrate from the diffusion of the ESD protection diode 523 through implanted ions.

In contrast, passive diffusions 507 and 509 of passive probe structures 503 and 505 have oversized dimensions and increased lateral spacing relative to ESD protection diode 523 to provide reduced attenuation in probed signals with reduced crosstalk interference. Furthermore, the increased lateral spacing of passive diffusions 507 and 509 from other structures enable exposure of passive diffusions 507 and 509 from the back side of the integrated circuit die with a reduced risk of leakage currents and damage to nearby structures in the semiconductor substrate.

Figure 6:
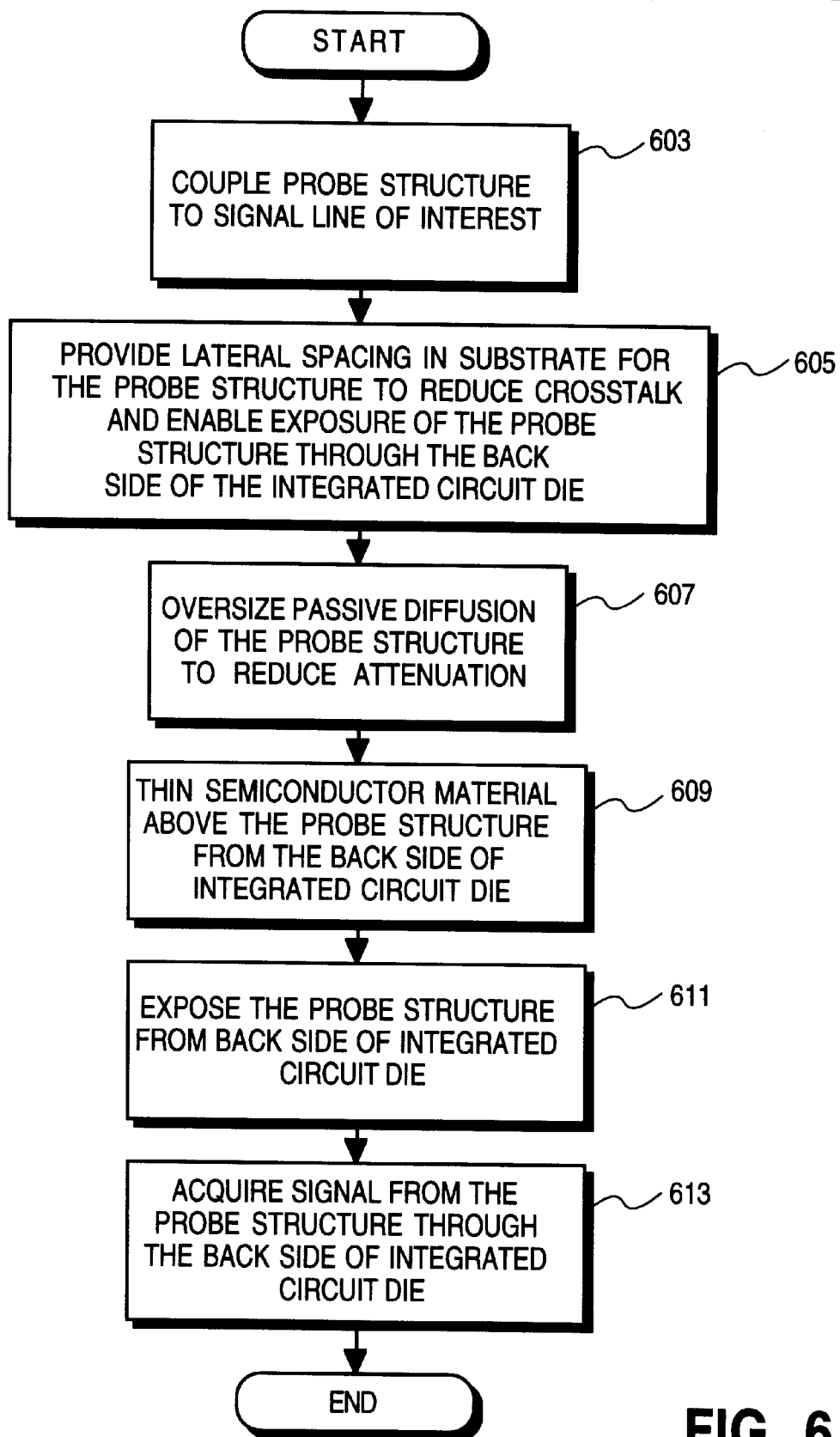
FIG. 6 is a flow chart diagram illustrating the steps performed to probe an integrated circuit using the disclosed probe structure in accordance with the teachings of the present invention.

Flow chart 601 of FIG. 6 is a diagram illustrating steps performed in accordance with the teachings of the present invention to enable probing of integrated circuits through the back side of an integrated circuit die. As shown in processing block 603, a passive diffusion is coupled to a signal line of interest in the integrated circuit die. The passive diffusion is oversized and is laterally spaced in the semiconductor die to reduce crosstalk interference and enable exposure of the passive diffusion through the back side of the integrated circuit die, as shown in processing blocks 605 and 607. When the passive diffusion is used for probing, the semiconductor is thinned from the back side of the integrated circuit die, as described processing block 609. Next, the passive diffusion is exposed from the back side of the integrated circuit die and a signal is then acquired from the passive diffusion in accordance with one embodiment of the present invention, as shown in processing blocks 611 and 613.

Thus, what has been described is a method and an apparatus for probing signals from an integrated circuit through the back side of a flip-chip mounted integrated circuit die. In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. In an integrated circuit die, a probe structure, comprising:
   a signal line disposed in a dielectric isolation layer of the integrated circuit die;
   a passive diffusion coupled to the signal line, the passive diffusion disposed in a semiconductor substrate of the integrated circuit die, the passive diffusion laterally spaced in the semiconductor substrate of the integrated circuit die at least approximately 1.0 microns from a nearest active diffusion disposed in the semiconductor substrate of the integrated circuit die.

2. The probe structure of claim 1 wherein the passive diffusion is laterally spaced in the semiconductor substrate of the integrated circuit die at least approximately 1.0 microns from a nearest other passive diffusion of another probe structure disposed in the semiconductor substrate.

3. The probe structure of claim 1 wherein the passive diffusion has a cross-sectional area of at least approximately 1.0 square microns.

4. The probe structure of claim 1 wherein the passive diffusion has a width of at least approximately 1.0 microns.

5. The probe structure of claim 1 wherein the passive diffusion comprises an N+ diffusion disposed in a P well disposed in the semiconductor substrate of the integrated circuit die.

6. The probe structure of claim 1 wherein the passive diffusion comprises an P+ diffusion disposed in an N well disposed in the semiconductor substrate of the integrated circuit die.

7. The probe structure of claim 1 wherein the integrated circuit die is included in a flip-chip mounted integrated circuit such that the probe structure is accessed through a back side of the integrated circuit die.

8. The probe structure of claim 1 wherein the passive diffusion is directly coupled through the signal line to an output of a transistor disposed in the integrated circuit die to probe an output signal of the transistor.

9. The probe structure of claim 8 wherein the passive diffusion is directly coupled through the signal line to a drain of the transistor.

10. The probe structure of claim 8 wherein the passive diffusion is directly coupled through the signal line to a source of the transistor.

11. The probe structure of claim 1 wherein the passive diffusion is directly coupled through the signal line to an input of a transistor disposed in the integrated circuit die.

12. The probe structure of claim 11 wherein the passive diffusion is directly coupled through the signal line to a gate of the transistor.

13. The probe structure of claim 11 wherein the probe structure is included in a cell library used during integrated circuit design.

14. A method of probing an integrated circuit die, the method comprising the steps of:

disposing a passive diffusion in a semiconductor substrate of the integrated circuit die;

coupling the passive diffusion to a signal line in the integrated circuit die; and probing the passive diffusion through a back side of the integrated circuit die.

15. The method of claim 14 including the additional step of globally thinning the integrated circuit die from the back side of the integrated circuit die, the thinning step performed before the probing step.

16. The method of claim 14 including the additional step of locally thinning the integrated circuit die from the back side of the integrated circuit die proximate to the passive diffusion, the thinning step performed before the probing step.

17. The method of claim 14 including the additional step of exposing the passive diffusion from the back side of the integrated circuit die, the exposing step performed before the probing step.

18. The method of claim 14 wherein the disposing step includes the step of laterally spacing the passive diffusion in the semiconductor substrate of the integrated circuit die at least approximately 1.0 microns from a nearest active diffusion disposed in the semiconductor substrate of the integrated circuit die so as to reduce crosstalk in a signal measured in the probing step.

19. The method of claim 14 wherein in the disposing step, the passive diffusion has a cross-sectional area of at least approximately one micron so as to reduce attenuation of a signal acquired in the probing step.

20. The method of claim 14 wherein the probing step is performed with a particle beam probe tool.

21. The method of claim 14 wherein the probing step is performed with a electron beam probe tool.

22. The method of claim 14 wherein the probing step is performed with an ion beam probe tool.

23. The method of claim 14 wherein the probing step is performed with a photon beam probe tool.

24. The method of claim 14 wherein the probing step is performed with an infrared beam probe tool through the back side of a silicon semiconductor substrate.

25. The method of claim 14 wherein the probing step is performed with a mechanical probe tool.

26. The method of claim 16 wherein the locally thinning step is performed with a focused ion beam milling tool.

27. The method of claim 17 wherein the exposing step is performed with a focused ion beam milling tool.

* * * * *